United States Patent
Desai et al.

(10) Patent No.: US 11,733,926 B2
(45) Date of Patent: Aug. 22, 2023

(54) COMMAND SEQUENCING FOR READ OPERATIONS BY SOLID-STATE DRIVES

(71) Applicant: Dell Products, L.P., Round Rock, TX (US)

(72) Inventors: Girish Desai, Fremont, CA (US); Frederick Lee, Mountain View, CA (US)

(73) Assignee: Dell Products, L.P., Round Rock, TX (US)

( * ) Notice: Subject to any disclaimer, the term of this patent is extended or adjusted under 35 U.S.C. 154(b) by 43 days.

(21) Appl. No.: 17/497,491

(22) Filed: Oct. 8, 2021

(65) Prior Publication Data
US 2023/0114146 A1    Apr. 13, 2023

(51) Int. Cl.
*G06F 3/06* (2006.01)

(52) U.S. Cl.
CPC .......... *G06F 3/0659* (2013.01); *G06F 3/061* (2013.01); *G06F 3/0604* (2013.01); *G06F 3/0653* (2013.01); *G06F 3/0679* (2013.01)

(58) Field of Classification Search
CPC ......... G06F 12/0246; G06F 2212/1024; G06F 2212/1032; G06F 2212/7206; G06F 2212/7208
See application file for complete search history.

(56) References Cited

U.S. PATENT DOCUMENTS

2022/0059171 A1*  2/2022  Goss .................. G11C 16/16

\* cited by examiner

*Primary Examiner* — Yong J Choe
(74) *Attorney, Agent, or Firm* — Fogarty LLP

(57) ABSTRACT

Systems and methods provide improved bus efficiency in read operations by a solid-state device (SSD) installed in an Information Handling System. A read operation is received that requests data stored in a die of the SSD. A command is issued to the die for use of a first read voltage in retrieving the requested data. Upon receiving confirmation that the die has retrieved the requested data, a command is issued to the die to configure a second read voltage for use in retrieving data requested by a second read operation received by the SSD. Concurrent with the die setting the second read voltage for use in retrieving the data requested in the second read operation, a command is issued to initiating transfer, by the die, of the data retrieved for the first read operation. In this manner, idle intervals in the bus used to service the die are eliminated.

15 Claims, 5 Drawing Sheets

COMMAND SEQUENCING FOR READ OPERATIONS BY SOLID-STATE DRIVES

FIELD

This disclosure relates generally to Information Handling Systems (IHSs), and more specifically, to solid-state drives (SSDs) utilized by IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

IHSs may utilize one or more storage drives for persistent storage of data. An IHS typically includes one or more persistent (i.e., non-volatile) data storage devices. For many years, IHSs relied on magnetic disk storage devices for persistent storage. As solid-state storage devices (SSDs) have become more affordable, they are an increasingly common choice for persistent storage for use by an IHS. When compared to conventional magnetic disk storage devices, solid state storage devices typically support faster read and write operations. In addition, solid state storage devices are suitable for many mobile device applications due to the stresses that mobile devices may place on the spinning and other moving parts of magnetic disk storage devices. A solid-state storage device may be accessed by a host IHS using a bus protocol that is supported by the SSD.

SUMMARY

In various embodiments, methods are provided that support read operations by a solid-state device installed in an Information Handling System, the method comprising: receiving a first read operation requesting data stored in a die of the solid-state device; issuing a command for the die to retrieve the data requested by the first read operation using a first read voltage; upon receiving confirmation that the die has retrieved the data requested by the first read operation, issuing a command to the die to configure a second read voltage for use in retrieving data requested by a second read operation received by the solid-state device; and concurrent with the die setting the second read voltage for use in retrieving the data requested in the second read operation, issuing a command initiating transfer, by the die, of the data retrieved for the first read operation.

In some additional method embodiments, the die is a NAND Flash die. In some additional method embodiments, a controller is coupled to the NAND Flash die via a NAND bus. In some additional method embodiments, the NAND bus has no idle intervals during completion of the second read operation. In some additional method embodiments, use of the first read voltage and the second read voltage by the NAND Flash die is configured by a NAND Set Feature command. In some additional method embodiments, the commands are issued to the NAND Flash die by the controller via the NAND bus. Some additional method embodiments include suspending the second read operation until the data retrieved for the first read operation has been transferred to the controller by the NAND die. In some additional method embodiments, the NAND die is configured to use the second read voltage for the second read operation while the second read operation is suspended and data retrieved for the first read operation is being transferred to the controller by the NAND die.

In various additional embodiments, solid-state devices may include: a die providing persistent storage of data; a bus coupling the die to a controller of the solid-state device; the controller supporting read operations on the solid-state device, the controller comprising a memory device having firmware instructions stored thereon that, upon execution by a logic unit of the controller, cause the controller to: receive a first read operation requesting data stored in the die of the solid-state device; issue a command for the die to retrieve the data requested by the first read operation using a first read voltage; upon receiving confirmation that the die has retrieved the data requested by the first read operation, issue a command to the die to configure a second read voltage for use in retrieving data requested by a second read operation received by the solid-state device; and concurrent with the die setting the second read voltage for use in retrieving the data requested in the second read operation, issue a command initiating transfer, by the die, of the data retrieved for the first read operation.

In some additional solid-state device embodiments, the die is a NAND Flash die. In some additional solid-state device embodiments, the controller is coupled to the NAND Flash die via a NAND bus. In some additional solid-state device embodiments, the NAND bus has no idle intervals during completion of the second read operation. In some additional solid-state device embodiments, use of the first read voltage and the second read voltage by the NAND Flash die is configured by a NAND Set Feature command. In some additional solid-state device embodiments, the commands are issued to the NAND Flash die by the controller via the NAND bus. In some additional solid-state device embodiments, execution of the firmware instructions further causes the controller to suspend the second read operation until the data retrieved for the first read operation has been transferred to the controller by the NAND Flash die.

In various additional embodiments, IHSs (Information Handling Systems) may include: one or more processors; one or more memory devices coupled to the processors, the memory devices storing computer-readable instructions that, upon execution by the processors, cause one or more software applications of the IHS to issue read operations to a solid-state device installed in the IHS; and the solid-state device comprising: a die providing persistent storage of data; a bus coupling the die to a controller of the solid-state device; the controller supporting read operations on the solid-state device, the controller comprising a memory device having firmware instructions stored thereon that, upon execution by a logic unit of the controller, cause the controller to: receive a first read operation requesting data stored in the die of the solid-state device; issue a command for the die to retrieve the data requested by the first read operation using a first read voltage; upon receiving confirmation that the die has retrieved the data requested by the first read operation, issue a command to the die to configure a second read voltage for use in retrieving data requested by a second read operation received by the solid-state device; and concurrent with the die setting the second read voltage for use in retrieving the data requested in the second read operation, issue a command initiating transfer, by the die, of the data retrieved for the first read operation.

In some IHS embodiments, the die is a NAND Flash die. In some IHS embodiments, the controller is coupled to the NAND Flash die via a NAND bus. In some IHS embodiments, the NAND bus has no idle intervals during completion of the second read operation. In some IHS embodiments, use of the first read voltage and the second read voltage by the NAND Flash die is configured by a NAND Set Feature command.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Figure 1:
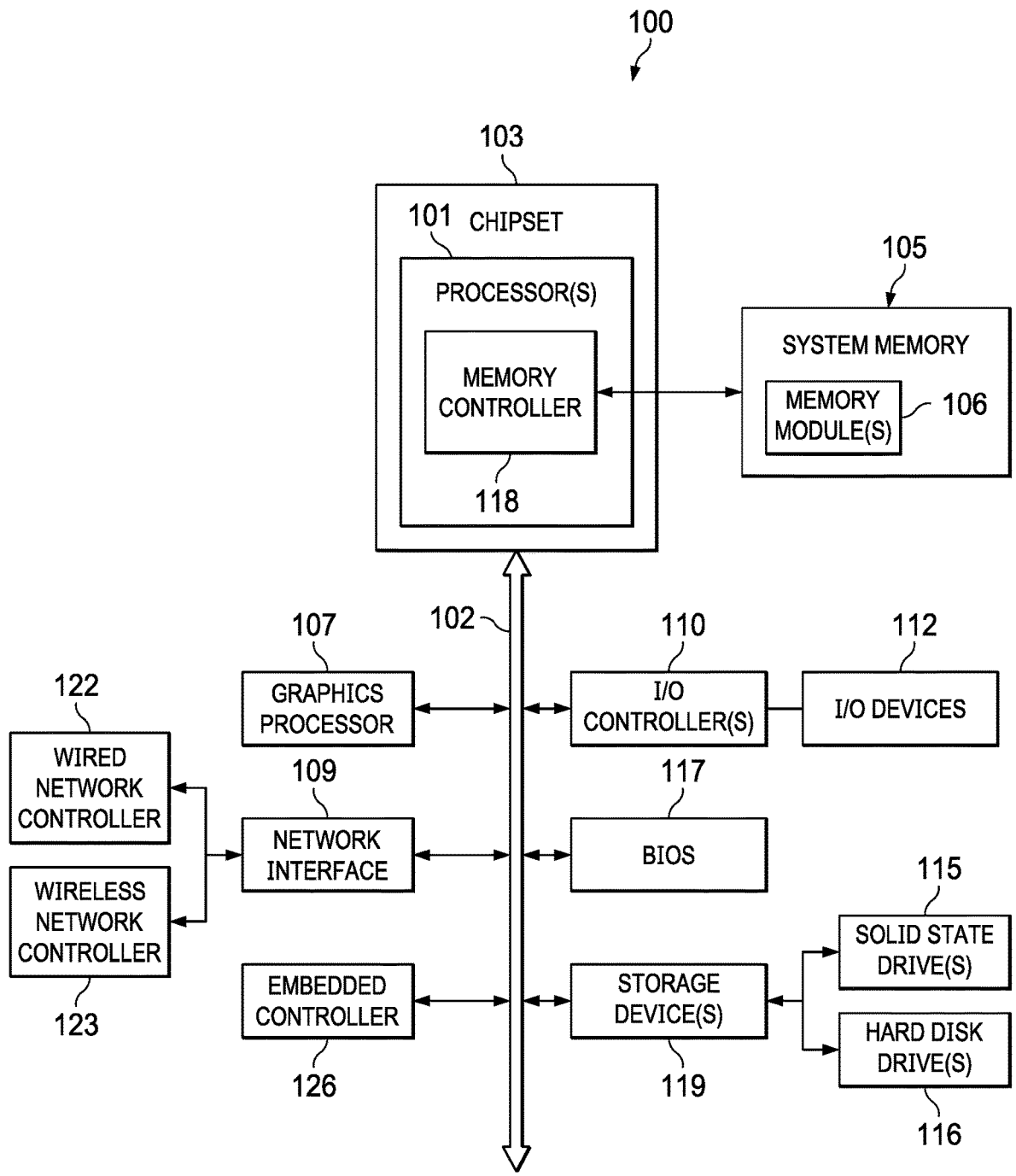
FIG. 1 is a block diagram depicting certain components of an IHS configured to implement command sequencing, according to various embodiments, for read operations by SSDs coupled to the IHS.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows various internal components of an example IHS configured to implement the provided embodiments. It should be appreciated that although certain embodiments described herein may be discussed in the context of a personal computer or rack-mounted server, other embodiments may be various other types of IHSs.

FIG. 1 is a block diagram depicting certain components of an IHS 100 configured to implement command sequencing, according to various embodiments, for read operations by SSDs 115 coupled to the IHS. IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs).

In the embodiment of FIG. 1, the processor 101 includes an integrated memory controller 118 that may be implemented directly within the circuitry of the processor 101, or the memory controller 118 may be a separate integrated circuit that is located on the same die as the processor 101. In certain embodiments, the memory controller 118 may be separate from the processor(s) 101 and may instead communicate with the processor(s) 101 via the chipset 102. The memory controller 118 may be configured to manage the transfer of data to and from the system memory 105 of the IHS 100. In certain embodiments, the memory controller 118 may also be responsible for refreshing any volatile memory components of the system memory 105. The system memory 105 provides the processor 101 with a high-speed memory that may be used in the execution of computer program instructions by the processor 101. Accordingly, system memory 105 may include memory components, such as dynamic RAM (DRAM) memory modules, suitable for supporting high-speed memory operations by the processor 101.

IHS 100 utilizes a chipset 103 that may include one or more integrated circuits that are connected to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of buses to provide the illustrated pathways served by bus 102.

As illustrated, a variety of resources may be coupled to the processor(s) 101 of the IHS 100 through the chipset 103. For instance, chipset 103 may be coupled to a network interface 109 that may support different types of network connectivity. In certain embodiments, IHS 100 may include one or more Network Interface Controllers (NICs), each of which may implement the hardware required for communicating via a specific networking technology, such as Wi-Fi, BLUETOOTH, Ethernet and mobile cellular networks (e.g., CDMA, TDMA, LTE). As illustrated, network interface 109 may support network connections by wired network controllers 122 and wireless network controller 123. Each network controller 122, 123 may be coupled via various buses to the chipset 103 of IHS 100 in supporting different types of network connectivity, such as the network connectivity utilized by applications of the operating system of IHS 100.

Chipset 103 may also provide access to one or more display device(s) via graphics processor 107. In certain embodiments, graphics processor 107 may be comprised within a video or graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) coupled to the IHS 100. The one or more display devices coupled to IHS 100 may utilize LCD, LED, OLED, or other display technologies. Each display device may be capable of receiving touch inputs such as via a touch controller that may be an embedded component of the display device or graphics processor 107, or may be a separate component of IHS 100 accessed via bus 102. In embodiments where IHS 100 is a laptop, tablet, 2-in-1 convertible device, or mobile device, display device may be an integrated display device. In some embodiments, IHS 100 may be a hybrid laptop computer that includes dual integrated displays incorporated in both of the laptop panels.

In certain embodiments, chipset 103 may utilize one or more I/O controllers 110 that may each support hardware components such as user I/O devices 112. For instance, I/O controller 110 may provide access to one or more user I/O devices 110 such as a keyboard, mouse, touchpad, touchscreen, microphone, speakers, camera and other input and output devices that may be coupled to IHS 100. Each of the supported user I/O devices 112 may interface with the I/O controller 110 through wired or wireless connections. In certain embodiments, sensors accessed via I/O controllers 110 may provide access to data describing environmental and operating conditions of IHS 100.

Chipset 103 also provides processor 101 with access to one or more storage devices 119. In various embodiments, storage device 119 may be integral to the IHS 100, or may be external to the IHS 100. In certain embodiments, storage device 119 may be accessed via a storage controller that may be an integrated component of the storage device, or a dedicated controller that manages use of multiple storage devices 119. In some instances, a storage controller may utilize storage devices 199 to provide support for RAID (Redundant Array of Independent Disks) configurations of logical and physical storage drives. In various embodiments, storage device 119 may be implemented using any memory technology allowing IHS 100 to store and retrieve data. In particular, IHS 100 may include one or more hard disk storage drives 116, such as SAS (Serial Attached SCSI) and SATA (Serial Advanced Technology Attachment) magnetic disk drives. As illustrated, IHS 100 also includes one or more solid-state storage drives (SSDs) 115, such as a NAND Flash drive, that provides persistent data storage to the IHS. Various components of IHS 100, such as the operating system of the IHS 100, may store and retrieve SSD 155 data. As described in additional detail below, an SSD 115 according to embodiments supports sequencing of commands used in read operations submitted to the SSD, where the sequencing improves the utilization of the SSD 115 and, in particular, improves the utilization of NAND buses used to support NAND Flash components of the SSD 115.

As illustrated, IHS 100 also includes a BIOS (Basic Input/Output System) 117 that may be stored in a non-volatile memory accessible by chipset 103 via bus 102. In some embodiments, BIOS 117 may be implemented using a dedicated microcontroller coupled to the motherboard of IHS 100. In some embodiments, BIOS 117 may be implemented as operations of embedded controller 126. Upon powering or restarting IHS 100, processor(s) 101 may utilize BIOS 117 instructions to initialize and test hardware components coupled to the IHS 100. The BIOS 117 instructions may also load an operating system for use by the IHS 100. The BIOS 117 provides an abstraction layer that allows the operating system to interface with the hardware components of the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Some IHS 100 embodiments may utilize an embedded controller 126 that may be a motherboard component of IHS 100 and may include one or more logic units. In certain embodiments, embedded controller 126 may operate from a separate power plane from the main processors 101, and thus from the operating system functions of IHS 100. In some embodiments, firmware instructions utilized by embedded controller 126 may be used to operate a secure execution environment that may include operations for providing various core functions of IHS 100, such as power management and management of certain operating modes of IHS 100.

In various embodiments, an IHS 100 does not include all of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the processor 101 as systems-on-a-chip.

Figure 2:
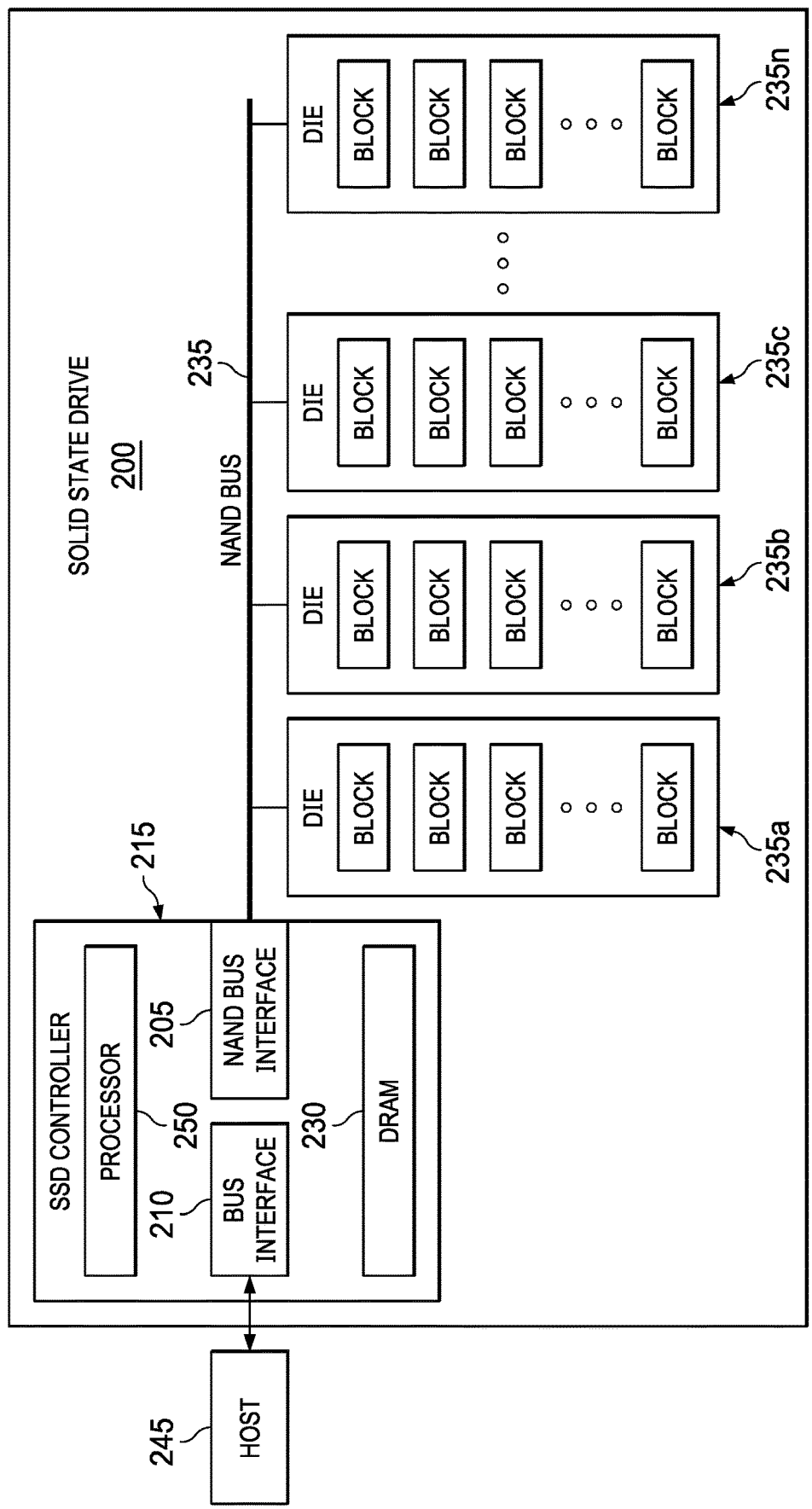
FIG. 2 is block diagram depicting certain components of a solid-state storage device configured according to various embodiments to implement command sequencing for read operations received by the SSD.

FIG. 2 is a diagram illustrating certain components of a solid-state storage device 200 configured according to various embodiments to implement command sequencing for read operations received by the SSD 200 from a host 245. The solid-state storage device 200 may be installed in an IHS and utilized to store information during operation of an IHS, such as described with respect to FIG. 1. In the embodiment of FIG. 2, the SSD bus interface 210, such as a PCIe connection, between the solid-state storage device 200 and a host 245 allows read and write operations to be submitted by the host 245 to the SSD 200. In some embodiments, the host 245 may be the processor of an IHS that interfaces with the SSD 200 via a PCIe bus interface 210. In some embodiments, the host 245 may be a storage controller of an IHS, such as described with regard to FIG. 1, where the bus interface 210 may be a PCIe bus or a bus utilizing various other communications protocols.

In the illustrated embodiment, the solid-state storage device 200 includes an SSD controller 215. In some embodiments, the SSD controller 215 may include a processing component 250, such as a microprocessor, microcontroller, application-specific integrated circuit (ASIC), or field-programmable gate array (FPGA). The SSD controller 215 may also include an internal memory 230, that may be a DRAM memory or other volatile memory. The processor or other logic unit 250 of the SSD controller 215 may be used to execute software instructions, in particular firmware and/or machine code that may be stored in internal persistent memory of the SSD and may implement operations supported by the SSD controller, such as read and write operations. In some embodiments, SSD controller 215 may manage various input and output queues that may be implemented using internal memory 230, where such queues may be utilized to temporarily store read and write operations that are received from host 245 until those received operations can be executed by SSD 200.

The read and write operations supported by SSD 200 may be used to access an array of non-volatile memory components 235a-n, such as NAND Flash memory dies, that provide the persistent storage of the solid-state storage device 200. In some embodiments, the SSD controller 215 utilizes firmware instructions retrieved from an internal data storage of the SSD to implement these read and write operations and thus providing logic by which to manipulate data that is stored in addressable cells or other logical storage locations of the array of memory components 235a-n. As illustrated, in some embodiments, an SSD controller 215 may include a NAND bus interface 205 that supports a NAND bus 235 that allows communications with each of the NAND Flash memory die 235a-n. In some embodiments, each NAND die 235a-n may be logically divided into an array of blocks, where each respective block may be further divided into an array of memory pages. Each of these memory pages of each of the NAND dies 235a-n may be comprised of large numbers of individually addressable memory cells.

When performing read operations on an individual NAND page, the SSD controller 215 selects a voltage for use by the NAND die in accessing this particular NAND page. The optimal read voltage for use in retrieving data stored in a particular NAND page may depend on various conditions of a NAND page and/or of the NAND cells that comprise a page, such as the program/erase (P/E) cycle count, the data retention time and various sources of temperature data for a cell, page, die and/or the SSD. In addition, the optimal read voltage for a NAND page may further depend on the location of the page on its respective NAND die 235a-n due to inherent physical differences within a NAND die and due to variations in the manufacturing processes for the NAND dies. The SSD controller 215 may thus set the read voltage for use by each individual read operation by a NAND die. According to some NAND Flash interfaces, an appropriate read voltage that is selected based on the conditions in the NAND device described above may be set in this manner using a Set Feature command that is supported by logic circuitry of each of the individual NAND dies 235a-n. If the read voltages to use for a read operation on a particular NAND die are different from the previously set value, a voltage setting command is sent to the NAND die to adjust the read voltages to the new value prior to reading data from the NAND page.

Embodiment may also operate using various generations of NAND Flash interfaces, such as the various versions of the ONFI (Open NAND Flash Interface), Toggle NAND Flash Interface and Serial NAND Flash Interface. Embodiment may operate using various types of NAND Flash memory, such as NAND memory that uses single-level cell (SLC), multi-level cell (MLC), triple-level cell (TLC), quad-level cell (QLC) and/or three-dimensional integrated circuit NAND technologies. In other embodiments, memory elements 235a-n may be implemented using other solid-state memory technologies other than NAND Flash memory. For example, at least some aspects described herein may be applicable to NOR Flash memory, phase-change memory (PCM) arrays, magneto-resistive random-access memory (MRAM) arrays and resistive random-access memory (ReRAM) arrays. Additionally, while only a single array of memory components 235a-n and a single NAND bus 235 is illustrated in FIG. 2, embodiments may include multiple such NAND buses that each support an array of NAND Flash memory dies. In such instances, each of the NAND buses may be operated by the SSD controller 215 in the manner described, thus multiplying the improvements in NAND bus utilization that are provided by the embodiments described herein.

Figure 3:
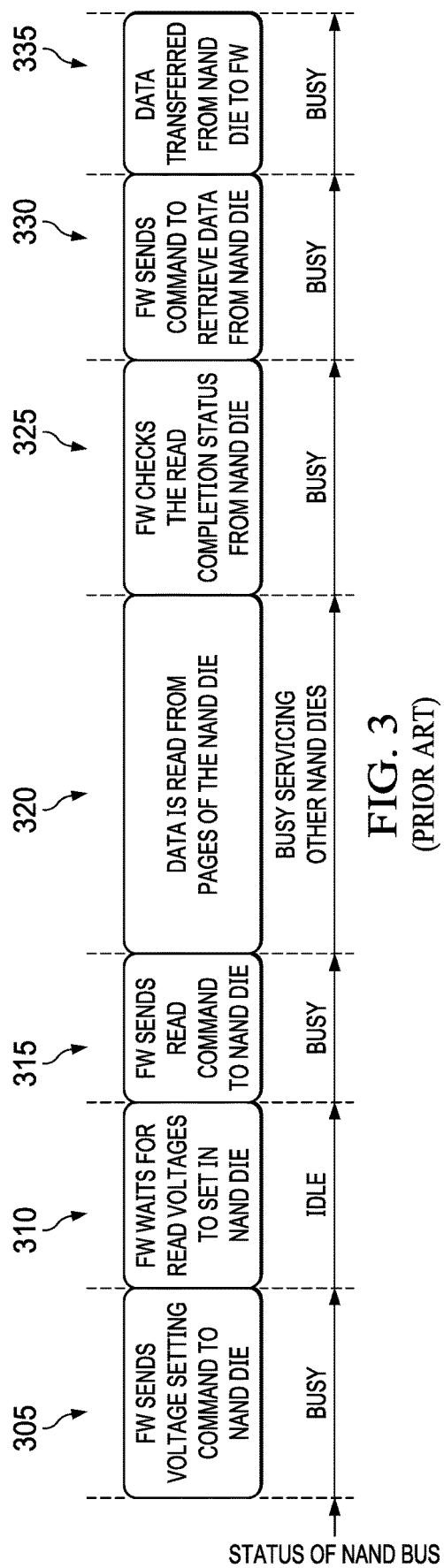
FIG. 3 is diagram illustrating existing command sequencing for NAND read operations.

FIG. 3 is a diagram illustrating command sequencing for NAND read operations in existing systems. In particular, FIG. 3 illustrates a sequence of commands issued by the firmware of an SSD to a NAND die in performing a read operation on a page of the NAND die. FIG. 3 also illustrates the status of the NAND bus that is used by the SSD controller in accessing that NAND die, such as NAND bus 235 of FIG. 2. As described, upon receiving a read operation, an SSD controller determines the read voltage for use in performing that particular read operation, where the read voltage may be selected based on the location of the NAND page, the condition of the NAND page and/or the condition of individual cells within that page, and based on various other conditions. Upon determining a read voltage for use by a read operation on a page of a particular NAND die, during interval 305, the firmware of the storage controller sends a command, such as a Set Feature command in some NAND Flash implementations, to the NAND die in order to set the read voltage that will be used by that NAND die. As indicated in FIG. 3, during interval 305, the NAND bus is busy in the transmission of the voltage setting command to the NAND die.

During the subsequent interval 310, the SSD controller firmware waits for the read voltage to be set by the NAND die. As indicated in FIG. 3, during this interval 310, the NAND bus is idle. As described in additional detail below, such periods where the SSD controller is waiting for the read voltage of the NAND die to be set may be of short duration, but may nonetheless result in a significant negative impact on the utilization of the NAND bus. Once the read voltage for the NAND die has been set, during interval 315, the SSD controller firmware sends the read command to the NAND die. The NAND bus is accordingly busy during interval 315 in transmitting the read command to the NAND die. During interval 320, the read operation is performed by the NAND die, using the read voltage that was set during interval 310 in order to retrieve a page of data. The length of time interval 315 that is required for the NAND die to retrieve the data that is requested by the read operation may be significant, in relative terms. As such, while the logic of the NAND die is occupied in retrieval of the requested data, the SSD controller may continue use of the NAND bus in processing commands directed at other NAND dies that are also serviced by the NAND bus.

During interval 325, the SSD controller returns to servicing the NAND die and issues a request checking the completion status of the read operation. As indicated, in checking this status, the NAND bus is busy during this interval 325. Once the SSD controller receives confirmation the read operation has been completed, during interval 330, the SSD controller firmware sends a command to the NAND die in order to retrieve the page of data that has been read from the NAND die and transferred to an internal page buffer of the SSD. In delivering this command, the NAND bus remains busy during this interval 330. In the final command of the sequence used in existing systems to implement NAND read operations, during interval 335, some or all of the buffered page is transferred from the NAND die to the SSD controller, where the data may then be queued for delivery to a host issuing the request for the data, if the error correction code (ECC) engine in the SSD controller successfully corrects all the error bits in the data.

The durations for each of the sequence of command intervals may vary, but are nonetheless predictable to a certain degree. The durations for intervals 305, 315, 325 and 330 are relatively short, because only NAND commands and status information are being transmitted during these intervals. For some NAND bus speeds, the durations of intervals 305, 315 and 325 are each approximately 0.5 µs and the duration of interval 330 is approximately 0.7 µs, with some variability attributed to delays that may be introduced by the CPU of the IHS. The duration of interval 335 may vary considerably depending on the size of the payload requested by the host. In a scenario where a 4 KiB payload is being transferred, the duration of interval 335 may be approximately 6.9 µs, for some NAND bus speeds and with some variability that may be attributed to CPU processing delays. The durations for intervals 310 and 320 may vary depending on various factors related to the NAND die. In addition, durations of these intervals may vary for different generations of NAND Flash interfaces (e.g., ONFI, Toggle, etc.), different types of NAND (e.g., TLC, QLC, MLC, etc.), and may be based on the storage capacity of the die from which the data is being read. In addition, the duration for 320 may also depend on the type of page from which data is being retrieved. For example, TLC NAND supports three types of pages on a single wordline: a lower page, a middle page and an upper page. QLC NAND similarly supports four types of pages on a single wordline from which data can be read. Inherent variations in the die and the location of a page within a die may also contribute some variability in the duration of these intervals. In typical instances, the duration of interval 310 for setting the read voltage of a NAND die is approximately 1 µs and the duration of interval 320 is approximately 60 µs.

As described, existing systems avoid idle time of the NAND bus during interval 320 by using the NAND bus to fulfill operations on other NAND dies that are also accessed by this NAND bus. However, in existing systems, the NAND bus remains idle during interval 310, while the SSD controller waits for the read voltage to be set by the NAND die. This is due to the duration of interval 310 being short relative to the overhead that is required to switch use of the NAND bus to another die and to schedule a resumption of the read operation once the read voltage has been set. Each of these individual idle intervals of the NAND bus that result from waiting for setting of read voltage of a NAND die are of relatively short duration, but may nonetheless result in significant impacts on bus utilization that may limit the read operation throughput of all of the dies serviced by a NAND bus.

In most SSDs, the number of NAND dies connected to a NAND bus is selected such that the NAND bus is fully utilized. However, in existing systems, the utilization rate for the NAND bus drops for every read operation that includes setting an updated read voltage for a NAND die and also results in the idle NAND bus during interval 310. For instance, using the representative durations provided above for the command sequence intervals, the sum of the intervals where the NAND bus is being used in operations on the NAND die of the read operation is 10.1 µs. As such, an idle time of 1 µs during interval 310 while the firmware waits for the read voltage of the NAND die to be set results in a 9.9% (1 µs/10.1 µs) decrease in the utilization rate of the NAND bus. Such setting of read voltages may be frequent since consecutive read operations may frequently target different blocks in a NAND die that are in different conditions, thus requiring different read voltages. This lower utilization rate for the NAND bus results in degradations in performance by the SSD.

As NAND bus speeds increase, idle NAND bus intervals waiting for read voltages to be set will result in greater decreases in bus utilization rates, thus negatively impacting the performance of an SSD further. For instance, a 50% increase in bus speeds will result in interval 335, in which the data that has been retrieved and buffered by the NAND die is transmitted from the NAND die to the SSD controller, decreasing from 6.9 µs to 3.45 µs. If all other interval durations in the command sequence remain the same, the idle bus interval 310 results in a 15.04% (1 µs/6.65 µs) decrease in the bus utilization rate. With an even greater impact for future NAND bus speeds, the idle time waiting for the setting of read voltages will be an even greater limiting factor on the throughput that may be supported for read operations by an SSD.

Figure 4A:
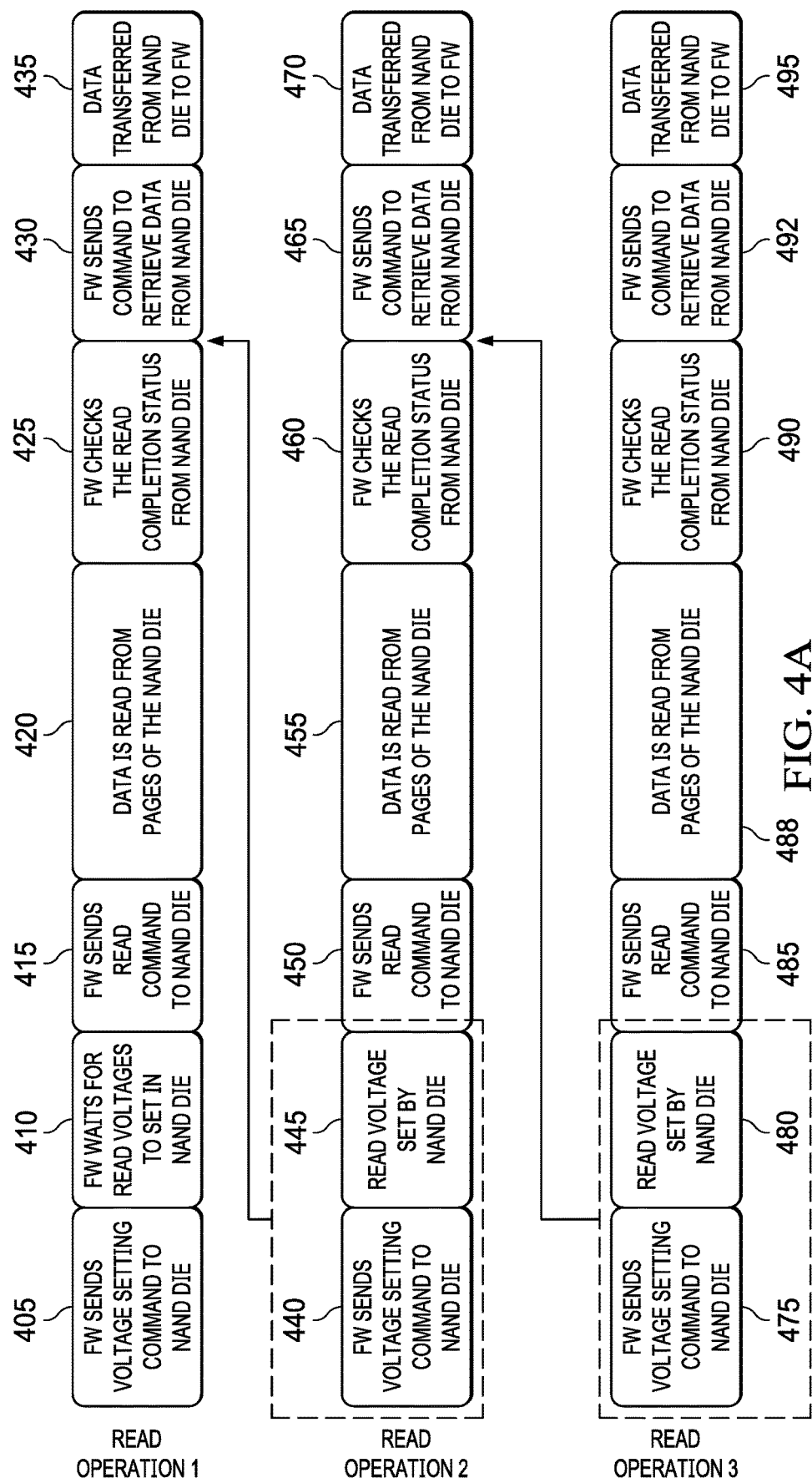
FIG. 4A is diagram illustrating command sequencing for NAND read operations according to embodiments.

FIG. 4A is a diagram illustrating command sequencing for NAND read operations according to embodiments. As above, embodiments begin with the receipt of an initial read operation by an SSD controller. The command sequence for this initial read operation, Read Operation 1, is provided in FIG. 4A. Upon receipt of Read Operation 1, an SSD controller according to embodiment identifies the NAND page in which the requested data is located and determines a read voltage for use by the NAND die in performing the read operation on that particular NAND page, where the read voltage may be selected based on the location of the NAND page, the condition of the NAND page, the condition of the cells within that page and/or based on various other conditions. As with the existing command sequence of FIG. 3, during interval 405, the firmware of the SSD controller according to embodiments sends a command to set the read voltage that will be used by that NAND die in Read Operation 1.

For an initial read operation received by an SSD according to embodiments, during interval 410, the SSD controller firmware waits for the read voltage to be set by the NAND die. For this initial read operation, the NAND bus remains idle for this interval 410. Once the read voltage for Read Operation 1 has been set, during interval 415, the SSD controller firmware sends the read command to the NAND die. During interval 420, the read operation is performed by the NAND die, using the read voltage that was set during interval 410. As above, during interval 420, an SSD controller according to embodiments may continue use of the NAND bus in processing operations directed at other NAND dies that are serviced by the NAND bus. During interval 425, an SSD controller returns to servicing the NAND die and issues a request checking the completion status of the read operation by the NAND die.

Unlike the existing command sequence of FIG. 3, in embodiments, once the NAND die is determined as having completed retrieval of the data for Read Operation 1, the SSD controller firmware is configured to look ahead to begin processing of another pending read operation. As indicated in FIG. 4A, rather than continuing processing of Read Operation 1, interval 425 is followed by interval 440, in which the SSD controller firmware issues a command to set the NAND read voltage for use in Read Operation 2. As described above, an SSD controller may utilize an internal memory for implementing various queues, such as queues for receiving incoming read operations until they can be processed by the SSD. In some embodiments, the SSD controller according to embodiments maintains a separate queue for each NAND die that is supported by the SSD. As read operations are received by the SSD, the controller firmware determines the NAND page, and thus the NAND die, in which the requested data is located and places the read operation in a queue that is reserved for pending read operations on that particular NAND die.

Accordingly, utilizing such queues of received read operations, upon verifying that the NAND die has retrieved the data requested by Read Operation 1, the SSD controller firmware according to embodiments determines that Read Operation 2 has been queued, where Read Operation 2 requests retrieval of data from this same NAND die as Read Operation 1. The SSD controller firmware then proceeds to interval 440 and dispatches a command to set the read voltage on the NAND die for use in completing Read Operation 2. As described in additional detail below, rather than waiting during interval 445 for the read voltage of the NAND die to be set for Read Operation 2, the SSD controller firmware may instead return to processing of Read Operation 1. As such, initiating interval 430, the SSD controller firmware issues a request for the NAND die to transmit the data that was retrieved for Read Operation 1 to the firmware.

In this manner, the SSD controller may continue use of the NAND bus for resuming processing of Read Operation 1 instead of waiting in an idle state for the setting of a read voltage for Read Operation 2. As indicated in FIG. 4A, upon the SSD controller firmware determining, in interval 460, that the data requested by Read Operation 2 has been retrieved by the NAND die, embodiments proceed to the next read operation in the queue for this NAND die. Accordingly, the SSD controller firmware proceeds, at interval 475, to set the read voltage for use in retrieving the data requested by Read Operation 3. As with Read Operation 2, rather than waiting for this read voltage for Read Operation 3 to be set, the SSD controller resumes processing of Read Operation 2 by initiating interval 465 in requesting the NAND die to transmit the data retrieved for Read Operation 2 to the SSD controller.

Figure 4B:
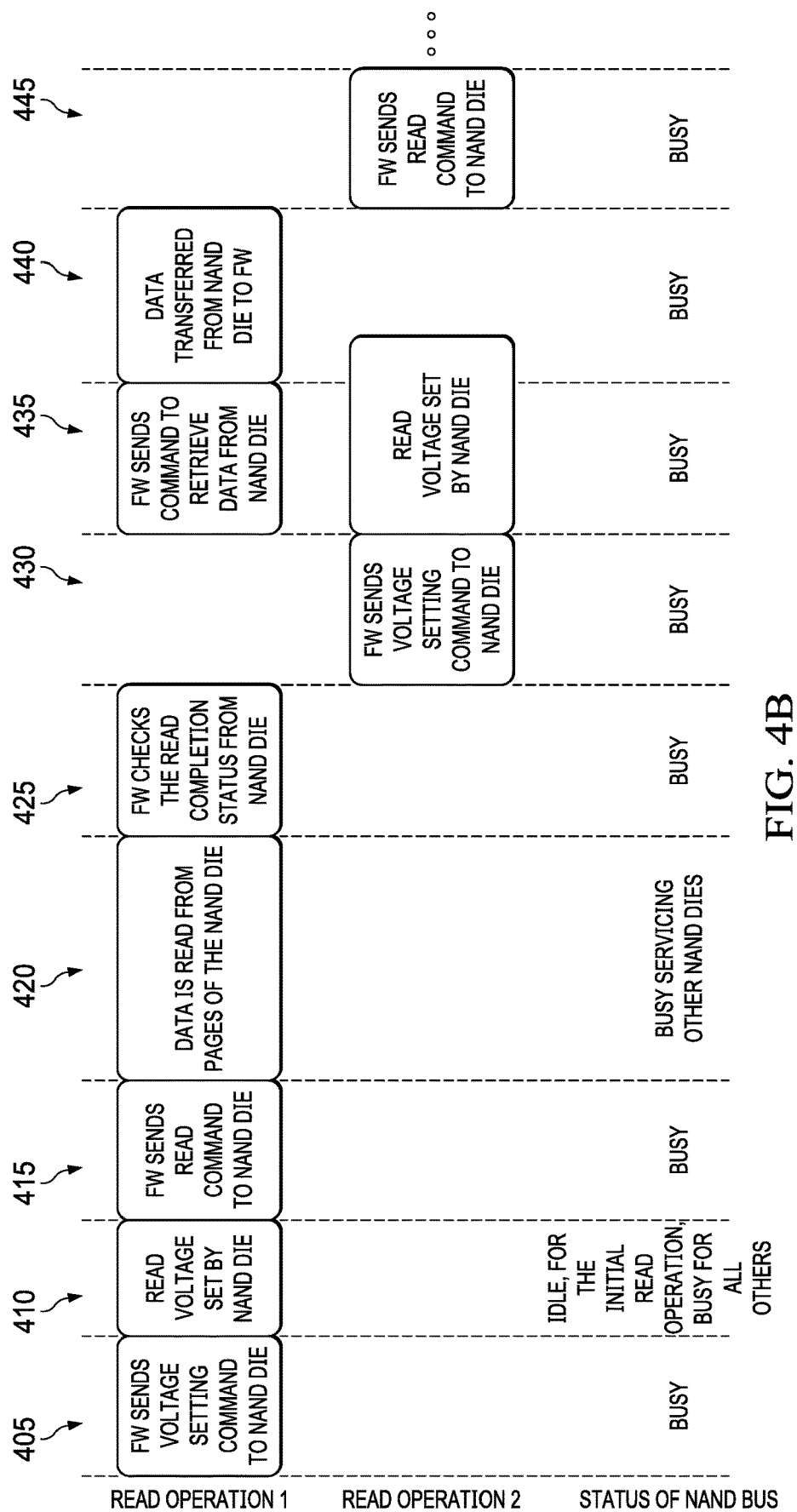
FIG. 4B is diagram illustrating additional aspects of command sequencing for NAND read operations according to embodiments.

FIG. 4B is a diagram illustrating additional aspects of command sequencing for NAND read operations according to embodiments. FIG. 4B illustrates the manner in which the commands for two successive read operations are sequenced such that the NAND bus includes no idle intervals, thus maximizing the utilization of the NAND bus. As described above, a first read operation is processed such that during interval 405, the SSD controller firmware sends a voltage setting command to the NAND die for use in retrieving the data requested by Read Operation 1. During interval 410, the NAND die sets the read voltage for Read Operation 1. When Read Operation 1 is the first read operation that is received or when read operations are not received in sufficient volume to result in read operations being queued until the SSD controller can process them, the firmware remains idle and waits until the NAND sets the read voltage. However, in all other instances when the SSD is receiving volumes of read operations that results in queuing, the setting of the read voltage for Read Operation 1 would be interleaved in the prior read operation (i.e., Read Operation 0) such that the NAND bus is busy during interval 410.

As described with regard to FIG. 4A, during interval 415, the firmware sends the read command for Read Operation 1 to the NAND die. While the NAND die performs that read operation during interval 420, the NAND bus is utilized by the controller to service operations on other NAND dies, thus maintaining full utilization of the NAND bus during this interval 420. During interval 425, the firmware checks and confirms that the NAND die has completed retrieval of the data requested for Read Operation 1. For instance, the NAND die may provide confirmation that the requested data has been retrieved and has been buffered for transfer to the firmware. As illustrated, rather than continuing with processing of Read Operation 1, the firmware instead suspends further processing of Read Operation 1 and instead begins interleaving commands for Read Operation 2, which has been queued for retrieval of data from the same die as the data from Read Operation 1.

With processing of Read Operation 1 suspended, during interval 430, the firmware initiates processing of Read Operation 2 by sending the NAND die a command to set the read voltage for Operation 2. The logic of the NAND die receives this command to set the read voltage and begins the NAND die circuitry reconfigurations required to adjust the voltage to be used in the next read operation that is received by the NAND die. As described, in existing systems, the NAND bus remains idle during this interval. However, as illustrated in FIG. 4B, rather than remaining idle during this interval 435, when the NAND die is reconfiguring the read voltage circuitry, the firmware instead continues use of the NAND bus in sending the NAND die a command to initiate transfer of the data retrieved by the NAND die for Read Operation 1. In many instances, the logic circuitry of a NAND die may independently perform NAND bus operations and data operations on cells of the NAND die. As such, a NAND die may simultaneously use peripheral circuits for configuring read voltages for use by NAND cells and use core logic circuits for supporting data transfer activities on the NAND bus.

Upon receipt of the request from the firmware for transfer of the data retrieved for Read Operation 1, during interval 440, the logic of the NAND die responds by transferring the buffered data to the firmware, where the retrieved data may be queued by the controller for delivery to the issuer of Read Operation 1 if the ECC engine in the SSD controller successfully corrects all the error bits in the data. Once this transfer of data has been completed, processing of Read Operation 1 by the NAND die is complete. The SSD firmware thus continues during interval 445 to resume processing of Read Operation 2. At this point, the NAND die has configured the read voltage for use in processing Read Operation 2. In resuming processing for Read Operation 2, the firmware utilizes the NAND bus to issue the read command corresponding to Operation 2 to the NAND die, which proceeds to retrieve the data using the read voltage set during interval 435. The processing of Read Operation 2 may continue, such that upon receiving confirmation that the NAND die has completed retrieval of the data for Read Operation 2, the firmware dispatches a command to reconfigure the read voltage of the NAND die for processing of a following read operation.

Through the use of embodiments, the time required for a NAND die to configure a read voltage can be overlapped with processing of certain commands from the prior read operation. By eliminating any waiting for read voltages to be set by a NAND die, embodiments support 100% utilization of the NAND bus. Embodiments thus ensure that a NAND bus is fully utilized when performing read operations and eliminate read performance degradation caused by NAND bus idle intervals. As NAND bus speeds increase, avoiding idle NAND bus intervals avoids even greater degradations in bus utilization rates.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for supporting read operations by a solid-state device installed in an Information Handling System, the method comprising:
receiving a first read operation requesting data stored in a die of the solid-state device, wherein the die is a NAND Flash die;
issuing a command for the die to retrieve the data requested by the first read operation using a first read voltage;
upon receiving confirmation that the die has retrieved the data requested by the first read operation, issuing a command to the die to configure a second read voltage for use in retrieving data requested by a second read operation received by the solid-state device;
suspending the second read operation until the data retrieved for the first read operation has been transferred to a controller by the die; and
issuing a command initiating transfer, by the die, of the data retrieved for the first read operation, wherein the die is configured to use the second read voltage for the second read operation while the second read operation is suspended and data retrieved for the first read operation is being transferred to the controller by the NAND die.

2. The method of claim 1, wherein a controller is coupled to the NAND Flash die via a NAND bus.

3. The method of claim 2, wherein the NAND bus has no idle intervals during completion of the second read operation.

4. The method of claim 1, wherein use of the first read voltage and the second read voltage by the NAND Flash die is configured by a NAND Set Feature command.

5. The method of claim 2, wherein the commands are issued to the NAND Flash die by the controller via the NAND bus.

6. A solid-state device comprising:
a die providing persistent storage of data, wherein the die is a NAND Flash die;
a bus coupling the die to a controller of the solid-state device;
the controller supporting read operations on the solid-state device, the controller comprising a memory device having firmware instructions stored thereon that, upon execution by a logic unit of the controller, cause the controller to:
receive a first read operation requesting data stored in the die of the solid-state device;
issue a command for the die to retrieve the data requested by the first read operation using a first read voltage;
upon receiving confirmation that the die has retrieved the data requested by the first read operation, issue a command to the die to configure a second read voltage for use in retrieving data requested by a second read operation received by the solid-state device;
suspend the second read operation until the data retrieved for the first read operation has been transferred to a controller by the die; and
issue a command initiating transfer, by the die, of the data retrieved for the first read operation, wherein the die is configured to use the second read voltage for the second read operation while the second read operation is suspended and data retrieved for the first read operation is being transferred to the controller by the NAND die.

7. The solid-state device of claim 6, wherein the controller is coupled to the NAND Flash die via a NAND bus.

8. The solid-state device of claim 7, wherein the NAND bus has no idle intervals during completion of the second read operation.

9. The solid-state device of claim 6, wherein use of the first read voltage and the second read voltage by the NAND Flash die is configured by a NAND Set Feature command.

10. The solid-state device of claim 7, wherein the commands are issued to the NAND Flash die by the controller via the NAND bus.

11. The solid-state device of claim 6, wherein execution of the firmware instructions further causes the controller to: suspend the second read operation until the data retrieved for the first read operation has been transferred to the controller by the NAND Flash die.

12. An IHS (Information Handling System) comprising:
one or more processors;
one or more memory devices coupled to the processors, the memory devices storing computer-readable instructions that, upon execution by the processors, cause one or more software applications of the IHS to issue read operations to a solid-state device installed in the IHS; and
the solid-state device comprising:
a die providing persistent storage of data, wherein the die is a NAND Flash die;
a bus coupling the die to a controller of the solid-state device;
the controller supporting read operations on the solid-state device, the controller comprising a memory device having firmware instructions stored thereon that, upon execution by a logic unit of the controller, cause the controller to:
receive a first read operation requesting data stored in the die of the solid-state device;
issue a command for the die to retrieve the data requested by the first read operation using a first read voltage;
upon receiving confirmation that the die has retrieved the data requested by the first read operation, issue a command to the die to configure a second read voltage for use in retrieving data requested by a second read operation received by the solid-state device;
suspend the second read operation until the data retrieved for the first read operation has been transferred to a controller by the die; and
issue a command initiating transfer, by the die, of the data retrieved for the first read operation wherein the die is configured to use the second read voltage for the second read operation while the second read operation is suspended and data retrieved for the first read operation is being transferred to the controller by the NAND die.

13. The IHS of claim 12, wherein the controller is coupled to the NAND Flash die via a NAND bus.

14. The IHS of claim 13, wherein the NAND bus has no idle intervals during completion of the second read operation.

15. The IHS of claim 13, wherein use of the first read voltage and the second read voltage by the NAND Flash die is configured by a NAND Set Feature command.

* * * * *